United States Patent [19]

Shigemasa et al.

[11] 3,757,174

[45] Sept. 4, 1973

[54] LIGHT EMITTING FOUR LAYER SEMICONDUCTOR DEVICE

[75] Inventors: Junichiro Shigemasa, Yamatokoriyama; Takeshi Sakurai, Nishinomiya; Zenpei Tani, Osaka, all of Japan

[73] Assignee: Sharp Kabushiki Kaisha, Osaka, Japan

[22] Filed: July 31, 1972

[21] Appl. No.: 276,532

Related U.S. Application Data

[63] Continuation-in-part of Ser. No. 45,299, June 11, 1970, abandoned.

[52] U.S. Cl. .... 317/235 R, 317/235 N, 317/235 AB

[51] Int. Cl. .......... H01l 11/10

[58] Field of Search .......... 317/235 N, 235 AA, 317/235 AB, 235 R

[56] References Cited

UNITED STATES PATENTS 2,855,524 10/1958 Shockly .......... 307/88.5

OTHER PUBLICATIONS

Shah, I.B.M. Tech. Discl. Bull., Vol. 10, No. 11, April, 1968

*Primary Examiner*—Martin H. Edlow

*Attorney*—Paul D. Flehr, Aldo J. Test et al.

[57] ABSTRACT

The two terminal diode type device exhibits a negative resistance characteristic and a high efficiency of light emission with an appreciable intensity. The device is a pnpn four layer structure of semiconductor material having a high band gap energy. The thickness of two base layers is similar to the diffusion length of minority carriers in the semiconductor material for low values of current flowing therethrough while at least one outer layer thereof has a thickness equal to or greater than another diffusion length of minority carriers for higher values of the current therethrough. Biasing connected between the two terminals forward biases the outer junctions and reverse biases the intermediate junction.

3 Claims, 7 Drawing Figures

JUNICHIRO SHIGEMASA
TAKESHI SAKURAI
ZENPEI TANI
INVENTORS

BY Flehr, Hohbach, Test, Albritton and Herbert
ATTORNEYS

JUNICHIRO SHIGEMASA
TAKESHI SAKURAI
ZENPEI TANI

INVENTORS

BY Flehr, Hohbach, Test, Albritton and Herbert
ATTORNEYS

LIGHT EMITTING FOUR LAYER SEMICONDUCTOR DEVICE

CROSS-REFERENCE TO RELATED APPLICATION

This application is a continuation-in-part of copending application Ser. No. 45,299 filed June 11, 1970, now abondoned, in the names of Junichiro Shigemasa, Takeshi Sakurai and Zenpei Tani, and assigned to the present assignee.

BACKGROUND OF THE INVENTION

This invention relates to a semiconductor device, and more particularly, to a device exhibiting a negative resistance characteristic and a high efficiency of light emission.

The field of optoelectronics is an unique branch which directly concerns future products such as light communication systems, light computers and solid-state image converters. Conventionally, the laser diode and the light emitting diode have been developed as elements which convert electrical energy to light energy. The photo-transistor, photo-conductor and the photo-diode have been developed as elements for energy conversion from light to electricity.

A circuit including the combination of said two types of elements coupled together through a medium of light may be obtained with relative ease, but it generally requires the addition to the light coupling system of a suitable switching element, amplifying element or oscillating element performing electrically or a circuit comprising one or more types of said elements in order to be assured of the satisfactory performance of the circuit. This means that any conventional optoelectronic circuit of the type mentioned tends to suffer from relatively complicated circuit combinations as a result of a large number of elements.

Research activities in this field have resulted in the development of several negative resistance light emitting diodes having a capability of dual performance. Although it may perhaps be conceived that use of said new type of device in an optoelectronic circuit allows an appreciable simplification in the foregoing combination, no industrial production of such a circuit simplified by incorporation of new devices has been realized. The new type light emitting diodes are mostly three-layer structures.

Such diodes, for example, consist of an n-type GaAs substrate, a high resistance region *i* obtained by doping a relatively deep level acceptor impurity such as Mn and a low resistance P-region obtained by further doping of a shallow level acceptor impurity such as Zn.

The i-region has deep electron-hole trapping centers of which a capture cross section for holes differs markedly from that for electrons. In such p-i-n structures double injection can result in a significant increase in lifetime in the i-region and cause the diode to exhibit negative resistance, as in effect, the i-region becomes conductivity modulated. For materials such as GaAs, their hole capture cross section is considerably larger than their electron capture cross section. In response to a low level forward bias below a threshold voltage, which provides a double injection of holes and electrons into the i-region, a very small current will flow. This is due to the injected holes becoming captured by trapping centers. As the threshold voltage is approached the electric field is increased to a point where the hole transit time across the i-region becomes the same order as the low level hole lifetime. This begins the negative resistance region. As more current is applied this phenomenon sweeps across the i-region and in effect converts this region into a semiconductor region wherein both the holes and electrons contribute to a greatly increased current flow. The p-i-n diodes therefore normally have two stable states between which they can be switched. However, they cannot be rapidly switched because of an increase in lifetime in the i-region. This device shows a remarkable negative resistance characteristic at extremely low temperature, e.g., at the temperature of liquid nitrogen (77°K), whereas it shows practically no such characteristic at room temperature. Furthermore, the p-i-n type diode fails to emit light at room temperature and the light emitting efficiency is extremely low. Good efficiency can be obtained only at extremely low temperature in the neighborhood of 77°K. For this reason, there is no reasonable possibility of use of these devices.

OBJECTS AND SUMMARY OF THE INVENTION

Accordingly, the primary object of this invention is to provide an improved light emitting semiconductor device which avoids one or more of the disadvantages and limitations of prior art devices.

Another object of this invention is to provide an improved semiconductor device as above which has satisfactory performance and a high dependability not only in the extremely low temperature region but in the room temperature region.

A further object of this invention is to provide an improved semiconductor device which has extremely high efficiency of light emission with an appreciable intensity even at room temperature.

It is still a further object of this invention to provide a semiconductor device which exhibits a negative resistance characteristic even at a room temperature.

A further object of this invention is to provide an improved semiconductor device which can be rapidly switched.

Another object of this invention is to provide an improved light emitting semiconductor device which provides a gate electrode capable of controlling the state of light emission.

In summary, this invention refers primarily to an improved semiconductor device comprising four pnpn layers each made of semiconductor material having a high band gap energy and a low resistance and means for forward biasing said four pnpn layers, two intermediate layers of which having a thickness similar to a diffusion length of minority carriers in the semiconductor material for small values of current therethrough and at least one outer layer having a thickness similar to or greater than another diffusion length of minority carriers therein for greater values of the current.

DETAILED DESCRIPTION OF THE PREFERRED EMBODIMENTS

Figures 1, 2, 3:
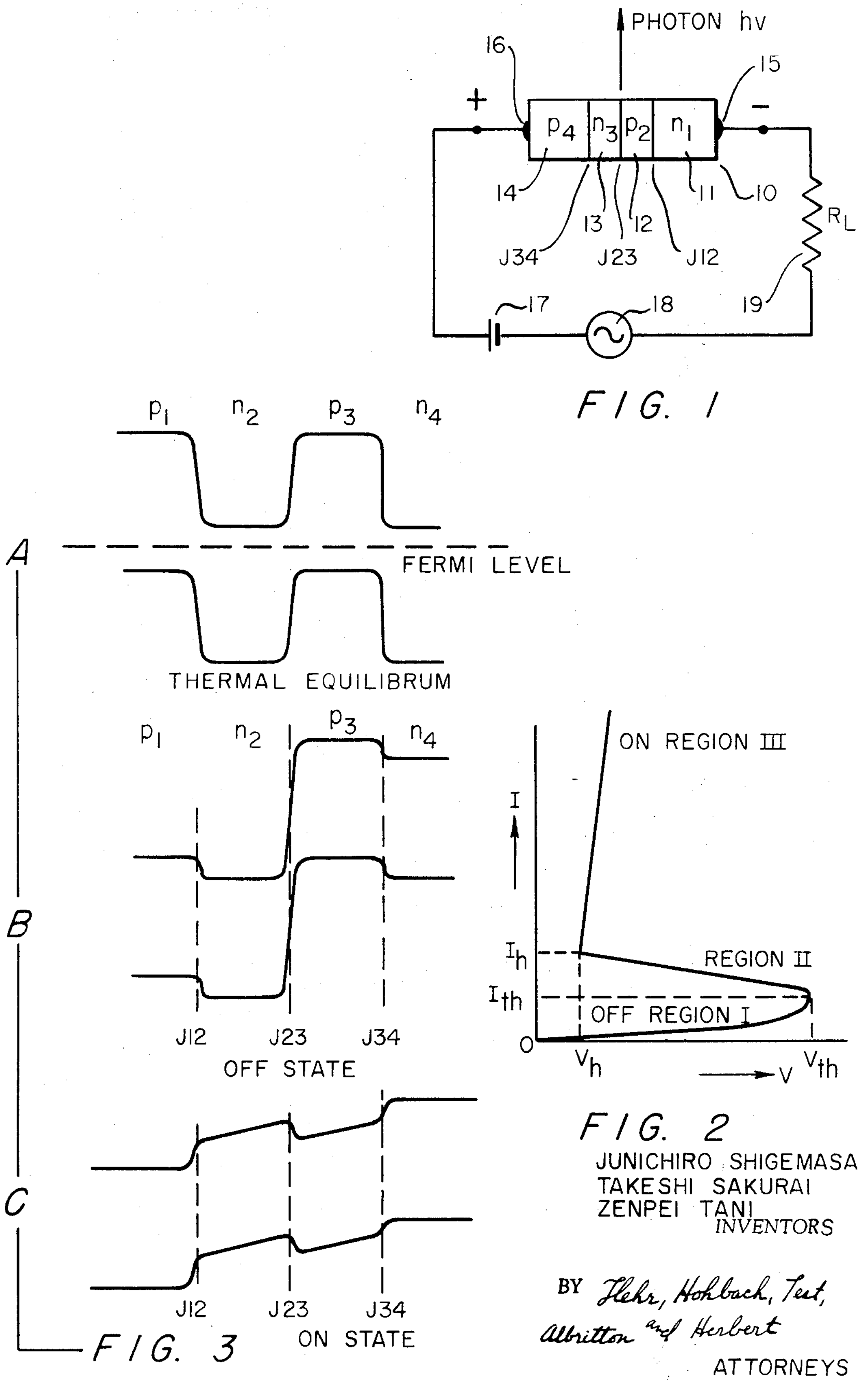
FIG. 1 is a cross-sectional view of the pnpn diode sturcture and accompanying circuit in accordance with this invention.
FIG. 2 is a graph of a typical voltage-current characteristic of the pnpn diode illustrated in FIG. 1.
FIG. 3 is a schematic representation of potential distribution of the same diode.

With reference to FIG. 1, there is illustrated in a cross-sectional view, a diode device 10 of four layer pnpn construction exhibiting a negative resistance characteristic and light emission.

The diode device 10 is fabricated from a semiconductor crystal wafer, the bulk of which is Si doped n-type GaAs single crystal ($n_1$)11. The semiconductor wafer 11 has a high band gap energy and a low resistance value. The devide includes an extremely thin Si doped p-type GaAs layer ($p_2$)12 and n-type GaAs layer ($n_3$)13 and a further Si doped p-type GaAs layer ($p_4$)14 all formed on one surface of semiconductor wafer 11. The boundaries between individual layers establish the junctions J12, J23 and J34. Each layer 12, 13 and 14 is formed typically by a liquid phase epitaxial growth process wherein a melt, such as Ga melt including a GaAs source and Si dopant (a so-called "amphoteric impurity"), is applied to the surface of the semiconductor wafer 11 and successively cooled. Two intermediate layers 12 and 13 have a thickness dimension identical with a diffusion length of minority carrier in GaAs for low values of current and, for example, are approximately 1–40$\mu$ in thickness, so that the diode device 10 effectively exhibits a negative resistance characteristic. Unless this requirement is satisfied, the diode 10 fails to provide a negative resistance.

In addition, provision of light emission is subject to the following limitations: in the event that the diode 10 is turned from a nonconductive state to a conductive state each diffusion length of minority carriers, in general, becomes greater than that in the nonconductive state or small current state because the current therethrough causes drift effects to take place at the base zones. In this case, very little recombination of holes and electrons occurs at the intermediate layers having a thickness equal to the diffusion length of minority carriers for low values of current and accordingly carriers pass through the intermediate layers 12 and 13 without stopping therein. Thus, no light emission appears at these positions. If each outer layer 11, 14 also has a thickness dimension identical with the diffusion length for low values of current, the diode device 10 does not show light emission as a whole.

In accordance with this invention the thickness dimension of the outer layer 11 and 14 is chosen so as to be equal to or greater than another diffusion length of minority carriers for higher values of current whereby providing high efficiency of light emission with an appreciable intensity. Hence, the diode device 10 embodying this invention includes two intermediate layers 12 and 13 of a thickness substantially identical with the diffusion length of minority carriers in the diode 10 in a small current state and further two outer layers 11 and 14 of a thickness identical with or greater than the other diffusion length of minority carriers in diode 10 in a large current state thereby meeting the requirements for exhibiting both the negative resistance characteristic and the light emission. In the GaAs devices the diffusion length of minority carriers in the P type and N type layers while in the conductive or high current state are about 50$\mu$ and about 10$\mu$ respectively. The upper layer 14 is of the thickness of approximately 100$\mu$ and the substrate 11 being of approximately 40$\mu$ in accordance with the preferred embodiment.

A pnpn diode 10 is made under the following conditions; the thickness of the n-type GaAs wafer 11 is about 40$\mu$. Free electron concentration by the Si dopant is $1 \times 10^{18}/cm^3$. The thickness of intermediate p-type and n-type layers 12, 13 are both 2–10$\mu$, with their electron concentration due to Si being about $s \times 10^{18}/cm^3$. The upper p-type layer is about 100$\mu$ in thickness and the electron concentration is about $1 \times 10^{18}/cm^3$. A first ohmic contact 15 is connected to the n-type substrate 11 and a second ohmic contact 16 is connected to the upper p-type layer 14.

Contacts 15 and 16 are adapted to have a source of exciting potential applied thereto from a bias source 17 for forward biasing the diode between low level and high level conditions or states. The biasing path also includes a signal source 18 and a load resistance 19 ($R_L$).

The pnpn diode 10 exhibits a negative resistance characteristic of current controlled type (otherwise called s type) illustrated by the voltage-current curve of FIG. 2. As is seen from this drawing, the characteristics are divided into three main regions; OFF state region (I), the negative resistance region (II) and ON state region (III). In explanation of the operation of the pnpn diode, the diode may be considered as two transistors consisting of $n_1p_2n_3$ and $p_2n_3p_4$. If the sum of the current amplification factors of the two transistors is less than unity, the pnpn diode is in an OFF state; where it is larger than unity, it is in an ON state.

Should the layers $p_4$ and $n_1$ be so biased that the former is positive and the latter is negative, the junctions J12 and J34 are forward biased while the intermediate junction J23 is backward biased, with the result that little current flows when the applied voltage is relatively low, corresponding to the region I in FIG. 2.

Increase of the applied voltage with the diode characteristics in region I gives rise to some electrons injected from the layer $n_1$ penetrating to the junction J34 with the resultant increase of holes injected from the layer $p_4$. When the injected holes from the layer $p_4$ reach the junction J12, they promote the injection of the electrons from the layer $n_1$, resulting in the increased injection of electrons and holes to the base regions $p_2$ and $n_3$. So-called "electron multiplication" results. On the other hand, the junction J23 is reverse biased so that it has a high potential across it, with the result that electron multiplication occurs caused by the electron avalanche triggered by breakdown. As a result of the interaction mentioned above, the layers $n_3$ and $p_4$ are flooded by electrons and holes respectively which accumulate and bias the junction J23 in the forward direction to reduce the potential across it gradually, with the resultant drop of the potential between the layers $n_1$ and $p_4$ (see region II in FIG. 2). This drop continues until the balance of the potential on the junction J23 is reached, which means a substantially conductive condition to allow a large current to pass. This conductive condition (ON state) provides the same voltage-current characteristic of this pnpn diode as of conventional pn diodes. FIG. 3 shows a schematic representation of potential distribution of the pnpn diode for the thermal equilibrium state (a), in biasing to the OFF state region (b) and the ON state (C).

As described hereinbefore, the pnpn diode does not include a semi-insulating layer formed by doping a relatively deep level impurity and does not utilize a double injection phenomenon so as to exhibit a negative resistance characteristic. There is therefore no possibility that at room temperature the pnpn diode is inoperative as is the conventional p-i-n diode which does not exhibit a negative resistance characteristic at room temperature since the smi-insulating layer becomes a conductor not an insulator at a room temperature. With the improved pnpn diode, threshold voltage, V*th*, and current, I*th*, and the holding voltage V*h* and current I*h* may be in the following ranges:

V*th* = 2 to 25 volts
I*th* = 0.1 to 20 mA
V*h* = 1.3 to 1.4 volts
I*h* = 1 to 70 mA These values are important to the pnpn diode for creating its characteristic as illustrated in FIG. 2. The holding voltage, V*h*, is a constant related to the type of semiconductor material. The threshold voltage, V*th*, and current, I*th*, are allowed to change according to the application of the pnpn diode. The switching or turning-on time of the pnpn diode is determined by the electron and hold transit time across the base regions of the pnp and npn transistors; the thinner the base regions, the higher the switching speed. Since two intermediate layers of the present pnpn diode are extremely thin, satisfying frequency response may be obtained. As already explained, in the event that the intermediate base layers have a thickness dimension greater than the diffusion length of minority carriers in GaAs for small values of current flowing therethrough, the holding current I*h* increases to an unlimited extent so that the diode 10 fails to exhibit a negative resistance characteristic curve at all.

The turn-on time of the above pnpn diode is around 1 $\mu$sec. This value is about one order smaller than that of the prior art Si pnpn switching diode discussed above. Furthermore, the pnpn diode can be rapidly switched since it does not include a high resistance layer formed by doping a deep level impurity thus differing from the conventional p-i-n diode.

Figure 4:
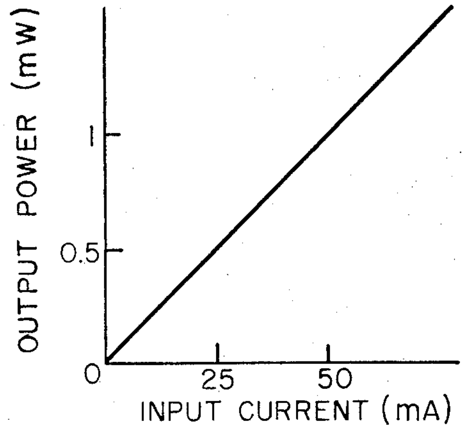
FIG. 4 is a graph of a typical current-radiation power output characteristic of the same diode.

The pnpn diode 10 also exhibits a light emission illustrated by the current-radiation power output curve of FIG. 4. The diode acts as an injection light emitting diode and the intensity of the emitted infrared light is proportional to the diode current. As shown in FIG. 4, the light output is approximately proportional to the driving current. This is regardless of the type of the region, positive or negative resistance, in which the diode is operating. Output power, P, can be expressed approximately by $$P \propto I^n$$

Where I: driving current
*n:* constant depending on the diode

The mechanism of light emission is, as is well known, arises from the recombination of holes and electrons. There is a high probability of recombination between the electrons injected from the layer $n_1$ and the holes injected from the layer $p_4$ taking place at both junctions J12 and J34 because of the construction of the pnpn diode. Light emission can occur more efficiently in the light emitting diode according to this invention than in the conventional light emitting diode.

Since the junctions J12 and J34 are forward biased while the intermediate junction J23 is backward biased, a part of the electrons injected from the layer $n_1$ recombines with holes within the same layer $n_1$. The remainder of the injected electrons reach the junction J34 recombining with the holes in layers $p_2$ and $n_3$ and further recombine with the holes in the vicinity of the junction J34 causing the electrons to gradually disappear. The same phenomenon applies to the holes injected from the layer $p_4$. When the injected electrons and holes cross the junction J23, they cause multiplication of carriers to occur. As a consequence of the carrier multiplication the injected electrons and holes pass through the junction J23 and the current flows through the junction to turn it to the on or high current state, with the result that the diffusion length of minority carriers in the respective layers becomes greater than in the small current state due to increase of current therethrough. As discussed above, in view of the provision of the negative resistance region the intermediate base layers should be of thickness equal to the diffusion length of minority carriers in the pnpn device in the small current state and accordingly the injected carriers pass through the base layers without stopping therein. Thus very little recombination of carriers occurs at the base layers. However, most of the injected carriers reach the outer layers 11 and 14 respectively to recombine with each other therein whereby the light emission mainly occurs at the outer layers. For instance, in the GaAs device the intensity of light from the outer P type layer 14, in fact, is greater than that from the N type substrate 11 since the light intensity is determined as a function of carrier mobility, diffusion length, carrier concentration, etc. At the same time, of course, the light emission also occurs in the vicinity of the outer junctions J12 and J34. In the case of the present GaAs device the diffusion length of the minority carriers in the P type layers is about 5$\mu$ when in the small current state and about 50$\mu$ when in the large current state.

Figure 5:
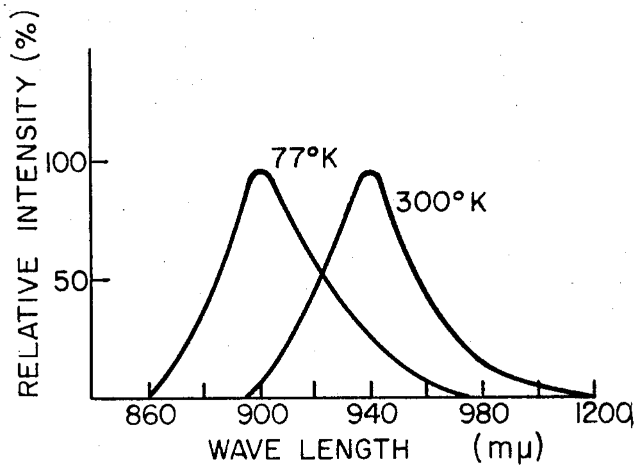
FIG. 5 shows the spectra of the radiation power output from the same diode.

FIG. 5 shows the spectra of the radiated power output from the pnpn diode. The radiation wavelength for the pnpn device is found to peak at about 940 m$\mu$ at room temperature, 300°K and at about 890 m$\mu$ at liquid nitrogen temperature, 77°K. The pnpn diode therefore operates satisfactorily even at room temperatures. The external quatum efficiency of the pnpn device is estimated to be 2 to 3 percent.

Figure 6:
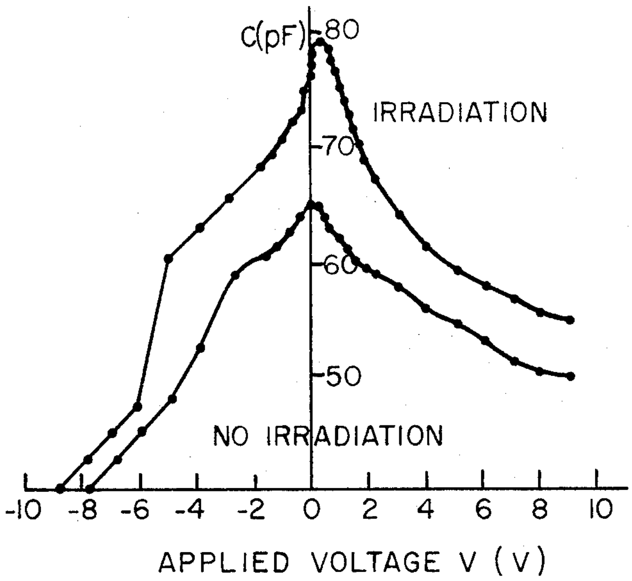
FIG. 6 is a graph of the voltage-capacitance characteristic of the same diode.

FIG. 6 shows an experimental result of bias voltage capacitance characteristic. Because of the pnpn construction, the pnpn diode is considered as a series of pn-np-pn diodes. It will be noted from the drawing of FIG. 6 that the characteristics for both the reverse and forward direction exhibit almost equal symmetry with the polarity of the biasing voltage. Also the characteristics are shifted vertically when the diode is irradiated.

An example of the method of making the pnpn diode of the type mentioned above follows. Only Si is used as an impurity. The three pnp layers 12, 13 and 14 may be formed on the n-type substrate 11 in a single process by a liquid phase epitaxially grown process. With GaAs, Group IV atoms such as Si, Ge and Sn can be either a donor or acceptor, and accordingly they may be termed a so-called "amphoteric impurity." The group IV atoms act as a donor when substituted for the Ga of GaAs and an acceptor when substituted for the As of the same. Generally, when growing the Si doped GaAs from molten liquid, an n-type layer may be formed by growth from the molten liquid in the stoichiometrical state. The GaAs realized by growth from the molten liquid including excess Ga derived from the stoichiometrical state tends to suffer from a reduction of the Si concentration in Ga sites, and a rise of the Si concentration in As sites. Growth of a Si doped GaAs epitaxial layer according to the liquid phase method gives rise to growth of n-type GaAs at a relatively high temperature, while transition takes place from n to p in the course of growth as the temperature decreases.

The temperature of the transition from n to p changes depending on various factors such as the crystal orientation of the GaAs and type of dopant, etc. It is, however, affected most by the cooling rate in the course of growth. This transition causes the behavior described above by causing the growth of p-type layer 12 at the start of cooling, then the growth of n-type layer 13, with the cooling rate increased, and subsequently by allowing the spontaneous transition to resume, the growth of the p-type layer 14. More specifically, when the temperature is first decreased at the low cooling rate of 0.2°C/min., p-type layer 12 is allowed to grow; then the n-type and p-type layers 13 and 14 are allowed to grow successively by rapid cooling at the rate of 10°C/min. This means that a three-layer p-n-p may be grown by merely controlling the cooling rate. The thickness of respective layers are determined by the cooling rate and time, and accordingly, the thickness can be optionally decided by controlling the time. The Si doped Ga-As negative resistance light emitting diodes grown according to the process as above is characteristically excellent in quantum efficiency of light emission; about 10 times that of conventional diodes.

The p-n transition effect and its cooling rate dependence might be explained phenomenologically as follows; in the process of Si doped liquid epitaxial growth, if the Ga and As contents in the molten zone are stoichiometrically balanced, usually the GaAs growth layer has n-type conductivity because the system has a tendency to produce a Ga vacancy, Vga, and it is substituted by an excess Si atom.

On the other hand, if the liquid system contains a certain amount of excess Ga, the situation is reversed. The important parameter for controlling the situation is the super cooling phenomenon near the liquid-solid interface region at a given temperature; that is, the tendencies yielding Vga or Vas would be determined by the difference of the segregation constants of Ga and As, and the diffusion constant of Si atoms into the vacancies. All parameters are temperature dependent. According to the basic experiment, for the Ga excess liquid system in the slow cooling rate region, concentration of arsenic vacancies, Vas, predominates as compared with that of Vga, so that substituiton of Si impurity for Vas gives p-type conductivity. But in the case of a high cooling rate, a super cooling phenomenon in the system promotes segregation of As atoms, and relatively increases Vga, as compared with Vas. Thus, conductivity type in the growth layer is reversed to n-type.

Such new epitaxial growth techniques allows large scale production of GaAs negative resistance light emitting diodes of the type mentioned above. These diodes may be put to practical use as pnpn switches or SCR's. In contrast, it is difficult to make similar GaAs elements by the use of conventional epitaxial growth techniques. This new technique is disclosed and claimed in a copending application in the names of Takeshi Sakurai and Zenpei Tani, entitled "Method of Making PN Junction," Ser. No. 47,031 filed June 17, 1970 and assigned to the present assignee.

The diffusion lengths of minority carriers for GaAs is very short ranging from 1–10$\mu$. The thickness of the two intermediate layers 12 and 13 must be controlled in such a way that these thicknessess are approximately equal to the diffusion lengths so as to exhibit a negative resistance characteristic. By conventional methods such controlling is impossible.

Figure 7:
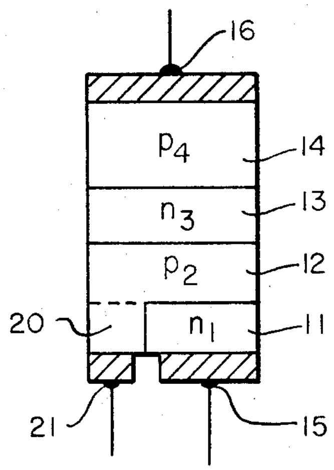
FIG. 7 is a cross sectional view of an alternative embodiment of the pnpn diode illustrated in FIG. 1.

The GaAs negative resistance light emitting diode of the present invention has the advantage that its light emission can be applied to an optical oscillator, optical amplifier, optical modulator and other various optical logic systems. The use of the pnpn diode can be widened by the adding of a gate electrode to one of the two intermediate base layers. A p-type region 20 is formed preferably by a diffusion process, the region 20 being typically Zn diffused into one intermediate layer 12. To this p-type region 20 a third ohmic contact 21 is connected. The device of FIG. 7 differs structurally from the device of FIG. 2 only in these points. With a forward bias potential to the anode contact 16 that is of a magnitude above the break down voltage, the pnpn diode is in an ON or high conduction state. At this time light emission occurs in the vicinity of the pn junctions J12 and J34. Even in a low conduction state upon the application of a forward bias to the gate contact 21 the pnpn diode is so triggered that it turns ON.

From the view point of application as an electronic amd optoelectronic circuit element, the present pnpn diode has several useful features as follows:

a. Amplification of electrical signal and conversion to light output
b. Oscillation of electrical signals and conversion to light output as a light pulse oscillator
c. Bistable switch or memory action
d. Modulation of light output from electrical signals
e. Optoelectronic coupler and isolator.

The semiconductors of intermetallic compounds of group III-V other than the GaAs considered are GaP, InP, GaSb, GaN, AlSb, AlAs, (GaAl)As, Ga(AsP) and (GaAl)P and the amphoteric impurities other than Si considered are Ge and Sn. This invention may be applied to the above semiconductors.

We claim:

1. A semiconductor device comprising four pnpn layers each composed of semiconductor material having a high band gap energy and means of forward biasing said four layer device, two intermediate layers thereof having a thickness approximately equal to a diffusion length of minority carriers in the semiconductor material for small values of current therethrough while at least one of the outer layers thereof having a thickness approximately equal to or greater than another diffusion length of minority carriers in the semi-conductor material for higher values of current whereby said device provides both the negative resistance and light emission wherein said semiconductor device has the pn pn layers composed of semiconductors of compounds of groups III-V.

2. A semiconductor devices as defined in claim 1 in which the pnpn layers are composed of GaAs, two intermediate layers thereof being about 1 to 40$\mu$ in thickness and at least one outer layer thereof being more than $50\mu$ in thickness.

3. A semiconductor device comprising a semiconductor element having first and second terminals and having a voltage-current characteristic with positive and negative resistance regions and exhibiting light emission which is proportional to the element current in both positive or negative resistance regions, said semiconductor element being of four-layer pnpn construction with three pn junctions, the thickness of the two intermediate layers being approximately equal to a diffusion length of the minority carriers in the semiconductor material for small values of the element current and the thickness of the outer layers being approximately equal to or greater than another diffusion length of the minority carriers in the semiconductor material for higher values of the element current, and biasing means connected between said first and second terminals of said element for forward biasing the two outer pn junctions of said three pn junctions and for backward biasing the intermediate pn junction, said element under the biased condition emitting light mainly in said outer layer, said biasing means including a series connected signal source for providing a sufficiently high potential across said element to cause a large carrier accumulation for cancelling said backward bias at said intermediate pn junction to allow the current to flow through said intermediate pn junction.

* * * * *